United States Patent
Radke (10) Patent No.: US 9,063,875 B2
(45) Date of Patent: *Jun. 23, 2015

(54) ERROR RECOVERY STORAGE ALONG A MEMORY STRING

(71) Applicant: Micron Technology, Inc., Boise, ID (US)

(72) Inventor: William H. Radke, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/263,825

(22) Filed: Apr. 28, 2014

(65) Prior Publication Data

US 2014/0325317 A1    Oct. 30, 2014

Related U.S. Application Data

(63) Continuation of application No. 13/919,982, filed on Jun. 17, 2013, now Pat. No. 8,713,401, which is a continuation of application No. 13/570,180, filed on Aug. 8, 2012, now Pat. No. 8,468,415, which is a (Continued)

(51) Int. Cl.
*G06F 11/10* (2006.01)
*H03M 13/25* (2006.01)
*H03M 13/29* (2006.01)

(52) U.S. Cl.
CPC ........ *G06F 11/1008* (2013.01); *G06F 11/1072* (2013.01); *H03M 13/256* (2013.01); *H03M 13/2909* (2013.01)

(58) Field of Classification Search
CPC ........... G06F 11/1072; G06F 11/1008; H03M 13/256; H03M 13/2909

USPC ......... 714/746, 752, 751, 753, 755, 756, 773, 714/774, 786, 791, 792, 795; 365/185.09
See application file for complete search history.

(56) References Cited

U.S. PATENT DOCUMENTS

| 4,112,502 A | 9/1978 | Scheuneman |
| 5,942,004 A | 8/1999 | Cappelletti |

(Continued)

FOREIGN PATENT DOCUMENTS

| JP | 9-261081 | 10/1997 |
| JP | 2000-68862 | 3/2000 |

(Continued)

OTHER PUBLICATIONS

European Patent Office; Extended European Search Report of Related European Application, Application No. 08851231.4; Mailing date Jan. 30, 2012.

(Continued)

*Primary Examiner* — John P Trimmings
(74) *Attorney, Agent, or Firm* — Knobbe Martens Olson & Bear LLP (57) ABSTRACT

Apparatus and methods store error recovery data in different dimensions of a memory array. For example, in one dimension, block error correction codes (ECC) are used, and in another dimension, supplemental error correction codes, such as convolutional codes, are used. By using separate dimensions, the likelihood that a defect affects both error recovery techniques is lessened, thereby increasing the probability that error recovery can be performed successfully. In one example, block error correction codes are used for data stored along rows, and this data is stored in one level of multiple-level cells of the array. Supplemental error correction codes are used for data stored along columns, such as along the cells of a string, and the supplemental error correction codes are stored in a different level than the error correction codes.

20 Claims, 7 Drawing Sheets

Related U.S. Application Data continuation of application No. 13/267,262, filed on Oct. 6, 2011, now Pat. No. 8,245,100, which is a continuation of application No. 11/774,316, filed on Jul. 6, 2007, now Pat. No. 8,051,358.

(56) References Cited

U.S. PATENT DOCUMENTS

| | | | |
|---|---|---|---|
| 5,956,743 | A | 9/1999 | Bruce et al. |
| 6,023,781 | A * | 2/2000 | Hazama .................... 714/773 |
| 6,279,133 | B1 | 8/2001 | Vafai |
| 6,591,394 | B2 | 7/2003 | Lee et al. |
| 6,628,723 | B1 | 9/2003 | Gerlach et al. |
| 6,731,538 | B2 | 5/2004 | Noda et al. |
| 6,732,322 | B1 * | 5/2004 | Miyauchi et al. .............. 714/784 |
| 6,839,870 | B2 | 1/2005 | Fanfelle |
| 6,871,303 | B2 | 3/2005 | Halter |
| 6,895,543 | B2 * | 5/2005 | Hazama .................... 714/773 |
| 7,061,804 | B2 | 6/2006 | Chun et al. |
| 7,184,356 | B2 | 2/2007 | Noguchi et al. |
| 7,389,465 | B2 | 6/2008 | Radke |
| 7,643,342 | B2 * | 1/2010 | Litsyn et al. ............. 365/185.09 |
| 7,844,879 | B2 * | 11/2010 | Ramamoorthy et al. ..... 714/763 |
| 7,904,780 | B2 * | 3/2011 | Brandman .................... 714/752 |
| 2002/0120820 | A1 | 8/2002 | Higuchi et al. |
| 2003/0156454 | A1 | 8/2003 | Wei et al. |
| 2004/0268065 | A1 | 12/2004 | Hilton et al. |
| 2005/0114587 | A1 | 5/2005 | Chou et al. |
| 2006/0221752 | A1 | 10/2006 | Fasoli et al. |
| 2007/0061689 | A1 | 3/2007 | Park et al. |
| 2007/0124647 | A1 | 5/2007 | Chen et al. |
| 2007/0171714 | A1 * | 7/2007 | Wu et al. .................. 365/185.09 |
| 2007/0171730 | A1 | 7/2007 | Ramamoorthy et al. |
| 2007/0266295 | A1 | 11/2007 | Conley |
| 2007/0266296 | A1 | 11/2007 | Conley |
| 2008/0034272 | A1 | 2/2008 | Wu et al. |
| 2008/0137414 | A1 | 6/2008 | Park et al. |
| 2008/0163023 | A1 * | 7/2008 | Hong et al. ................... 714/752 |
| 2008/0168319 | A1 * | 7/2008 | Lee et al. ..................... 714/746 |
| 2008/0320361 | A1 | 12/2008 | Fukuda et al. |
| 2009/0013234 | A1 | 1/2009 | Radke |
| 2009/0100307 | A1 | 4/2009 | Lee |
| 2010/0023800 | A1 | 1/2010 | Harari et al. |
| 2010/0115376 | A1 | 5/2010 | Shalvi et al. |
| 2011/0060969 | A1 * | 3/2011 | Ramamoorthy et al. ..... 714/773 |

FOREIGN PATENT DOCUMENTS

| | | |
|---|---|---|
| JP | 2000149592 | 5/2000 |
| KR | 100766042 | 10/2007 |
| WO | WO 2004062113 | 7/2004 |
| WO | WO 2006070668 | 7/2006 |
| WO | WO 2007084751 | 7/2007 |
| WO | WO 2008/069385 | 6/2008 |
| WO | WO 2008/078866 | 7/2008 |

OTHER PUBLICATIONS

The International Bureau of WIPO; International Preliminary Report on Patentability of related PCT Application No. PCT/US2008/068236, filed Jun. 25, 2008; mailing date Jan. 21, 2010; Geneva, Switzerland.

The International Bureau of WIPO; International Preliminary Report on Patentability of related PCT Application No. PCT/US2008/068240, filed Jun. 25, 2008; mailing date Jan. 21, 2010; Geneva, Switzerland.

Korean Intellectual Property Office; "Notification of Transmittal of the International Search Report and the Written Opinion of the International Searching Authority, or the Declaration", "Written Opinion of the International Searching Authority", and "International Search Report" of related PCT application PCT/US/2008/081475, filed Oct. 28, 2008; mailed Feb. 18, 2009; Daejeon, Republic of Korea.

Korean Intellectual Property Office; "Notification of Transmittal of the International Search Report and the Written Opinion of the International Searching Authority, or the Declaration", "Written Opinion of the International Searching Authority", and "International search report" of related International Application PCT/US2008/081743, filed Oct. 28, 2008; Dated Feb. 19, 2009; Daejeon, Republic of Korea.

International search report mailed Dec. 29, 2008 in PCT Application No. PCT/US2008/068240.

International search report mailed Jan. 20, 2009 in PCT Application No. PCT/US2008/068236.

USPTO; Office Action dated Sep. 9, 2010, from related U.S. Appl. No. 11/944,023(filed Nov. 21, 2007).

USPTO; Office Action dated Dec. 9, 2010, from related U.S. Appl. No. 11/944,023(filed Nov. 21, 2007).

USPTO; Office Action dated Jan. 11, 2011, from related U.S. Appl. No. 11/774,377 (filed Jul. 6, 2007).

USPTO; Office Action dated May 16, 2011, from related U.S. Appl. No. 11/774,377 (filed Jul. 6, 2007).

European Patent Office; Extended European Search Report of related European Application, Application No. 08852229.7; Report issue date Nov. 22, 2011.

USPTO; Office Action dated Dec. 9, 2011, from related U.S. Appl. No. 13/281,007 (filed Oct. 25, 2011).

USPTO; Office Action dated Oct. 3, 2011, from related U.S. Appl. No. 13/154,150 (filed Jun. 6, 2011).

USPTO; Office Action dated Oct. 3, 2012, from related U.S. Appl. No. 13/570,180 (filed Aug. 8, 2012).

Japanese Patent Office; Office Action dated Jun. 11, 2013, from related application Japanese Patent Application No. 2010-534994.

Japanese Patent Office; Office Action dated Jun. 11, 2013, from related application Japanese Patent Application No. 2010-534993.

USPTO; Office Action dated Sep. 6, 2013, from related U.S. Appl. No. 13/919,982 (filed Jun. 17, 2013).

* cited by examiner

FIG. 7

ERROR RECOVERY STORAGE ALONG A MEMORY STRING

CROSS-REFERENCE TO RELATED APPLICATIONS

This application is a continuation application of U.S. application Ser. No. 13/919982, filed on Jun. 17, 2013, now issued as U.S. Pat. No. 8,713,401 on Apr. 29, 2014, which is a continuation application of U.S. application Ser. No. 13/570, 180, filed on Aug. 8, 2012, now issued as U.S. Pat. No. 8,468,415 on Jun. 18, 2013, which is a continuation application of U.S. application Ser. No. 13/267,262, filed Oct. 6, 2011, now issued as U.S. Pat. No. 8,245,100 on Aug. 14, 2012, which is a continuation application of U.S. application Ser. No. 11/774,316, filed Jul. 6, 2007, titled ERROR RECOVERY STORAGE ALONG A NAND-FLASH STRING, now issued as U.S. Pat. No. 8,051,358 on Nov. 1, 2011, the entireties of which are hereby incorporated by reference.

This application is related to commonly-owned application titled DATA STORAGE WITH AN OUTER BLOCK CODE AND A STREAM-BASED INNER CODE, Ser. No. 11/774, 377, filed on Jul. 6, 2007, now U.S. Pat. No. 8,065,583, issued Nov. 22, 2011, the entirety of which is hereby incorporated by reference.

BACKGROUND

1. Field of the Invention

Embodiments of the invention generally relate to integrated circuits. In particular, embodiments of the invention relate to memory circuits.

2. Description of the Related Art

Flash memory is a form of erasable and reprogrammable non-volatile memory. In a flash memory, memory cells are arranged in "blocks" for erasure. After a block has been erased, it is ready for programming if desired. NOR flash memory is a type of flash memory that offers access to individual bytes for retrieval of data, but has relatively low density.

NAND flash memory is a type of flash memory that offers relatively high density. The high density is achieved in part by forming columns of cells connected in series. In addition, with NAND flash memory, data is retrieved in relatively large groups of bytes, such as a page of data. For example, a page can correspond to a row or to a portion of a row in an array.

For example, a memory array of cells for storing data is typically arranged in a 2-dimensional array of rows and columns. These arrays can vary greatly in size. When the cells of the array are capable of holding 2 or more levels, that is, multiple levels or two or more bits of data per cell, the array effectively holds data in 3 dimensions.

In a typical array for NAND flash memory, sources and drains of flash cells are arranged in series (source to drain) and referred to as columns. Along rows are "word lines" that control the gates of cells. Data is typically accessed a row at a time, with one bit from each column. The word line for the row to be read is set to a particular voltage for reading the stored state(s) of the cells. Different voltage levels can be used for multiple-level cells. The other row lines for the other cells of the columns are set to turn "on" the cells to permit the reading of the stored state(s) of the cells of the row through the corresponding cells in the columns.

The number of bytes per row can vary in a very wide range as can the number of bytes in a "page." Some manufacturers define a page by a certain amount of data, so that, for example, two pages of data can correspond to one word line (row). For the purposes described herein, a "page" of data corresponds to the amount of data that is written to or read from the NAND flash memory array during a write cycle or read cycle. In one example, 2,112 bytes are retrieved by activation of a word line. Of these 2,112 bytes, 2,048 are data bytes and 64 are spare bytes, which are typically used for error correction codes (ECC), wear-leveling information, or other overhead data. Error correction codes increase the robustness of the stored data. Typically, a form of block code is used to generate the error correction codes, such as cyclic redundancy check (CRC) checksums, Reed-Solomon error correction, or the like. These error correction codes detect if there were errors in the reading of the data bytes and can typically correct errors in the data bytes provided that the errors do not exceed the capability of the error correction code.

Flash memory has many uses. Examples include flash memory hard drives (replacements for hard drives), USB flash drives or thumb drives, mobile phones, digital cameras, digital media players, games, memory cards, navigation devices, personal digital assistants, computers, or the like. Within limits, the error correction codes can correct many errors in the data in the data bytes. However, beyond these limits, data with errors cannot typically be corrected. For example, if a word line fails, then there can be problems reading data for the entire row. This typically results in too many errors for the error correction codes to correct. Depending on the criticality of the data, the effects of uncorrectable errors in data can range from inconvenient to catastrophic.

BRIEF DESCRIPTION OF THE DRAWINGS

These drawings and the associated description herein are provided to illustrate specific embodiments of the invention and are not intended to be limiting.

DETAILED DESCRIPTION OF SPECIFIC EMBODIMENTS

Although particular embodiments are described herein, other embodiments of the invention, including embodiments that do not provide all of the benefits and features set forth herein, will be apparent to those of ordinary skill in the art.

Figure 1:
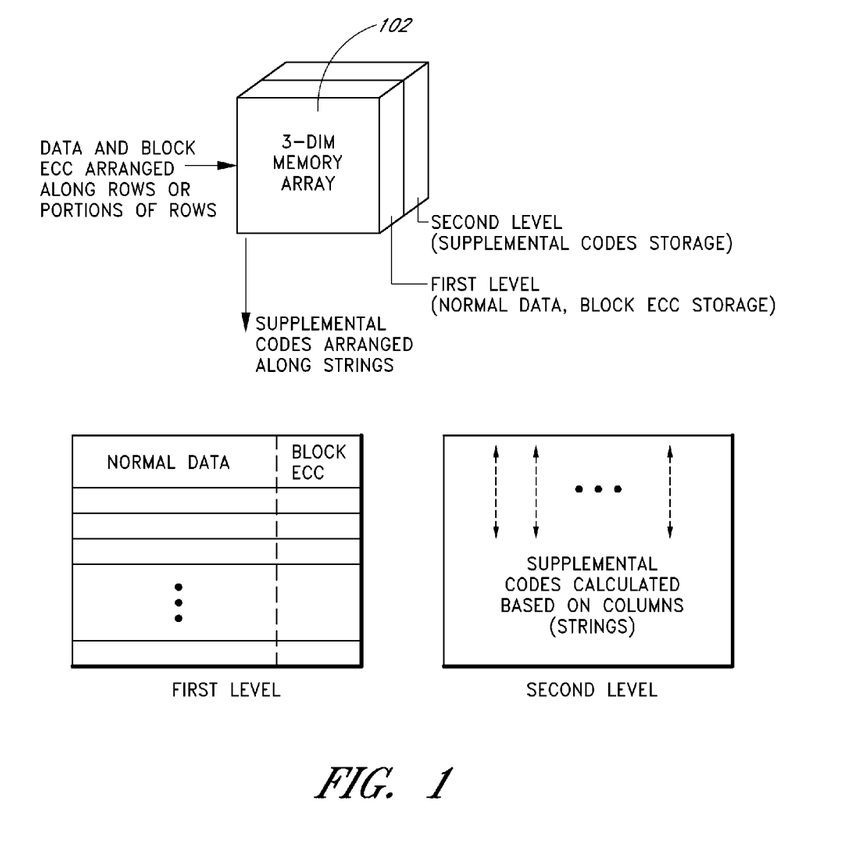
FIG. 1 illustrates a conceptual view of using different dimensions of an array to store error correction data.

FIG. 1 illustrates a conceptual view of using two different dimensions of a NAND flash memory array 102 to store error correction data. In one embodiment, this error correction data includes a combination of block error correction codes arranged along rows for coding and decoding and supplemental error correction codes, such as convolutional codes, arranged along columns for coding and decoding. In contrast to block codes, which process data in blocks, the supplemental error correction codes process data in streams or channels. These supplemental error correction codes ("supplemental codes") should be able to be incrementally updateable so that as particular pages of data are written across one or more rows, the supplemental code can be generated and written. Examples of suitable supplemental codes includes, but is not limited to, convolutional codes, partial-response, maximum likelihood (PRML) codes, trellis-coded modulation (TCM), and turbo codes. This permits embodiments of the invention to recover data correctly even when traditional block error correction codes (block ECC) are unable to recover the data correctly. Cells of the NAND flash memory array 102 have two or more levels for data storage such that each cell can store two or more bits of data. In one level, data is stored in rows of the NAND flash memory array 102 with block ECC data. For example, conventional techniques of storing normal data and block ECC data in rows of a first level can be used. Typically, for efficiency, the block ECC data for a row or a portion of a row is also stored on that row. However, it will be understood that block ECC data can be stored in another row, or even another block of data. Nonetheless, the block ECC data is based on data arranged in rows.

In a second level of the flash cells, supplemental codes, such as convolutional codes, of the data in the first level are stored. In contrast to the block ECC computed and stored across rows, the supplemental codes are stored down a string of cells. This makes data available for correction of errors in another dimension of the array such that even if an otherwise catastrophic failure such as a word line failure occurs, the supplemental error correction technique exists and is available for the recovery of data. Convolutional codes are well-suited to a column-based error recovery because the columns are not necessarily completely written. For example, block error correction codes work well with rows or within rows of an array because a page is written at a time. By contrast, a string of memory cells in a column can spans many different rows and many different pages, and may be incrementally written. Convolutional codes can provide for recovery codes while data is incrementally written.

Figure 2:
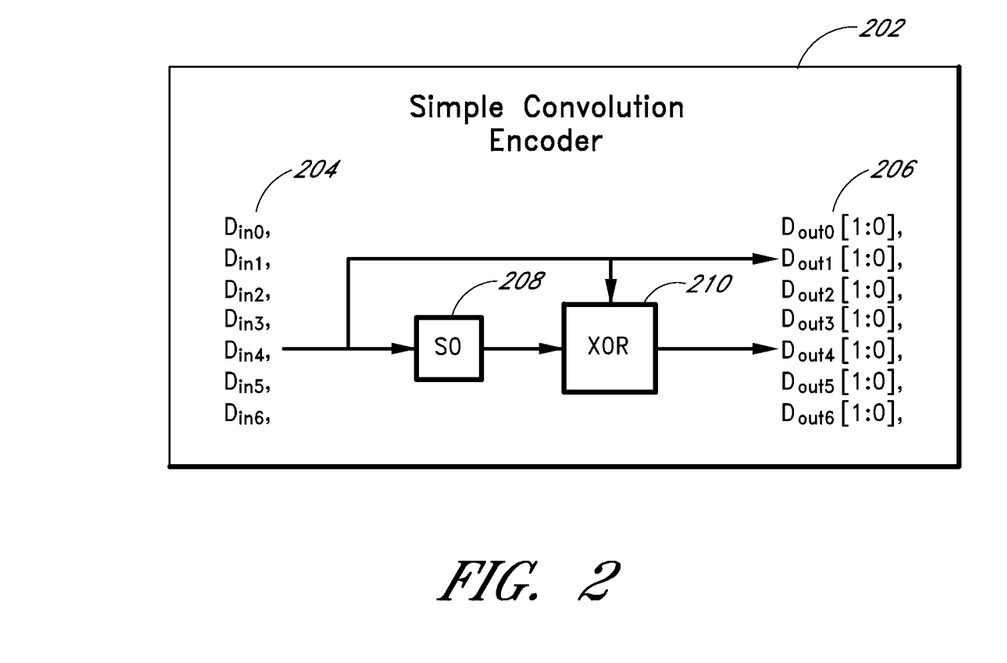
FIG. 2 is a schematic illustrating an example of convolutional encoding.

FIG. 2 illustrates an example of a convolutional encoder 202 for supplemental coding. While illustrated in the context of convolutional codes, the principles and advantages are applicable to other types of codes. Supplemental coding can be performed by hardware or by software (or firmware as applicable), or by a combination of both. In one embodiment, supplemental coding is performed by dedicated hardware integrated with a memory device or by a controller outside the memory device. The particular convolutional encoder 202 illustrated in FIG. 2 is a simple example of convolutional coding and is not intended to be limiting. An implementation of convolutional coding can vary widely with respect to many parameters, such as, but not limited to, constraint lengths, generator polynomials, and the like.

Data 204 indicates the normal data stored in the NAND flash memory array 102. The normal data 204 is actually arranged along rows, such that the Data 204 shown spans multiple pages, i.e., is not contiguous normal data. Data 204 is stored in, for example, level 1 of the memory cells and is arranged in columns of the NAND flash memory array 102 (FIG. 1). Data 206 indicates the convolutional coded data for data 204. In the simple example, data 204 is convolved using a register 208 and an exclusive-OR (XOR) gate 210. Typically, the NAND flash memory array 102 will have a predetermined sequence in which the row lines are activated for the writing or programming of data. Accordingly, the computation of convolutional coding should also follow the writing sequence of the corresponding NAND flash memory array 102.

When data is physically written to or read from the NAND flash memory array 102, the data is typically stored or retrieved a row at a time. A row of data can intersect many individual cells (one per string), and in one embodiment, the convolutional coding and decoding is performed at the same time for many strings at once. For example, the individual data bits from a logically adjacent previously written row can be retrieved and convolutional coded with the data for the row to be written so that the multiple individual cells of a row are processed in parallel. Similarly, for decoding, the decoding of convolutional codes, such as via exclusive-OR (XOR) operations, of coded data retrieved from the row can be combined with normal data bits retrieved from a logically adjacent row to decode the desired data.

In the illustrated example, the lower number bits are written earlier than the higher numbered bits. The register 208 can be initialized to zero for the first data bit (first memory cell of the string), or can be initialized to one.

In one embodiment, the data 204 is stored in a cache prior to writing in the NAND flash memory array 102 (FIG. 1). The convolutional coding is performed using the data 204 from the cache, and the data 206 is stored in the cache. The data 204, 206 can then be efficiently stored in the NAND flash memory array 102. For example, data for the NAND flash memory array 102 is typically written in sequential order by activating the appropriate rows in sequence.

Figure 3:
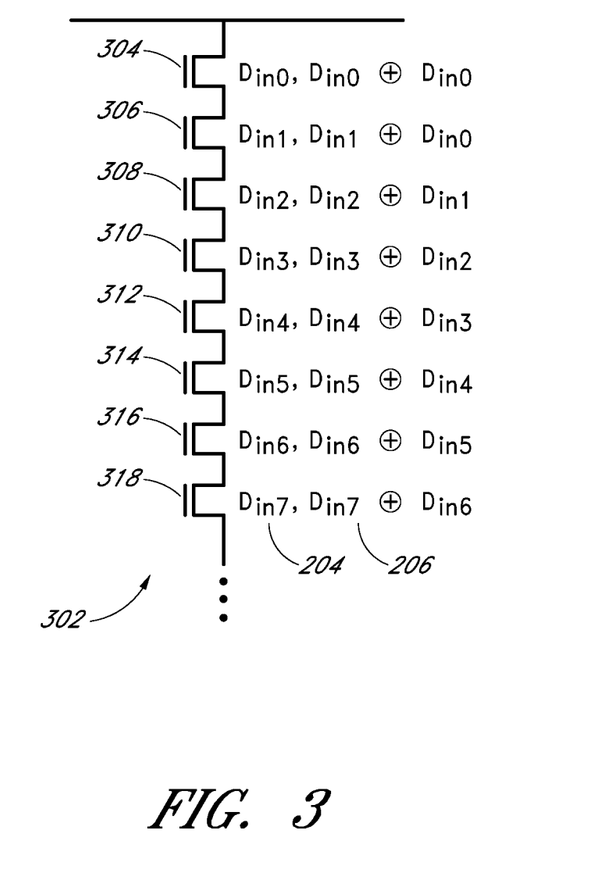
FIG. 3 is a schematic illustrating an example of a string (column) for a NAND flash memory, with stored data indicated to the right.

FIG. 3 illustrates an example of a string (column) 302 for the NAND flash memory array 102 (FIG. 1), with stored data indicated to the right. The NAND flash memory array 102 has many such strings. In one embodiment, the number of strings in a particular page is 16,896 (2,112 bytes*8 bits/byte), however, it will be appreciated that the number of strings can vary in a very broad range and will vary with the number of blocks. The number of memory cells 304, 306, 308, 310, 312, 314, 316, 318 per string 302 can vary in a very wide range. Typical numbers include 8, 16, and 32 cells per string. The disclosed techniques are not particular to a specific number of cells per string. The illustrated NAND flash memory array 102 has two-level cells, i.e., each cell can store 2 bits of data. The illustrated techniques can be expanded to multi-level cells (MLC) having more than two-levels. The numbers of rows, columns, and levels can vary in a very broad range and can depend on the configuration of the memory, the desired memory size, and the like.

In a first level of the memory cells 304, 306, 308, 310, 312, 314, 316, 318, the data 204 is stored. The first level is the level that is typically read for the retrieval of data. In a second level, the data 206 is stored. This data 206 is used when the data 204 has been corrupted. In the illustrated example, the data 206 corresponds to the exclusive-OR of the corresponding data bit of the first level and the preceding data bit of the same string of the first level. It should be noted that in a normal read or write operation, data is read or written along word lines or row, so that the data stored in a string is typically not adjacent data as normally read or written. In the illustrated embodiment, the register 208 is initialized to zero so that for the first data bit, the first data bit is an exclusive-OR (XOR) with 0, such that the data stored in the second level for the first memory cell 304 is a repeat of the data stored in the first level, i.e., is redundant. In FIG. 3, the symbol "⊕" indicates the XOR operator.

For example, if there is a problem with the data 204 ($D_{in1}$) for the word line corresponding to the cell 306, to recover the data ($D_{in1}$), the data 206 ($D_{in1} \oplus D_{in1}$) from the cell 306 and the data 204 ($D_{in0}$) from the cell 304 can be used to recover the data ($D_{in1}$). In another example, if there is a catastrophic problem with the cell 306, such as a problem with a word line, that could render both the data 204 ($D_{in1}$) and the data 206 ($D_{in1} \oplus D_{in0}$) unreadable, the data 204 ($D_{in1}$) for the cell 306 can be recovered from the cell 308 from the next row. For example, from the cell 308, the data 204 ($D_{in2}$) and the data 206 ($D_{in2} \oplus D_{in1}$) can be decoded to recover the data 204 ($D_{in1}$) for the cell 306. However, it should be noted that since data is written to flash memory in sequence, the row for the cell 308 may or may not have been written at the time that recovery of the data for the cell 306 is desired.

Figure 4:
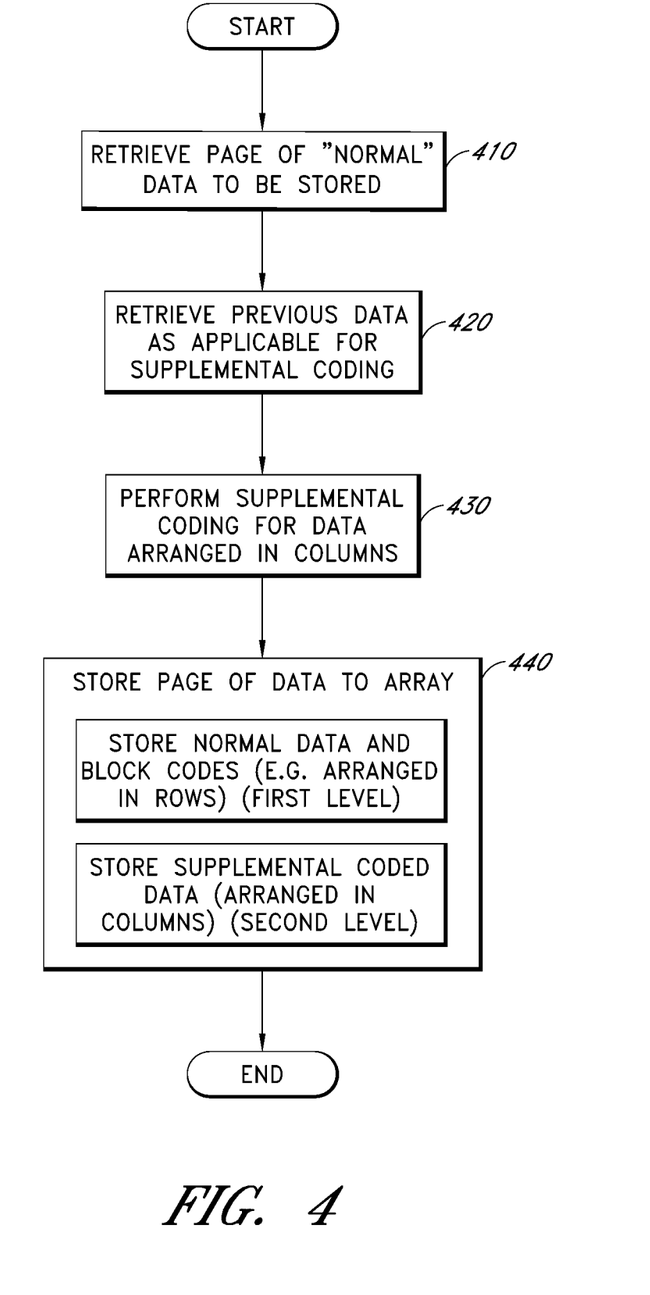
FIG. 4 is a flowchart of a process for writing data to the NAND flash memory.

FIG. 4 is a flowchart of a process for writing data to the NAND flash. It will be appreciated by the skilled practitioner that the illustrated process can be modified in a variety of ways. For example, in another embodiment, various portions of the illustrated process can be combined, can be rearranged in an alternate sequence, can be removed, and the like. The process can be performed in hardware or software, and within a memory chip or outside the memory chip.

NAND flash is generally organized into blocks and pages. The sizes of the blocks and pages can vary in a very broad range. For example, in one embodiment with a 2 gigabyte (Gb) memory array, there are 2,048 blocks, each block having 64 pages, with each page having 2,112 bytes, including 2,048 data bytes and 64 spare bytes. In a flash memory device, erasure occurs at the block level, and programming occurs at the page level. Only the erased pages (partially or fully erased) of a block can be programmed. If the applicable pages of a block are already erased, then those pages can be programmed. Otherwise, the appropriate partial or full erase procedures should be invoked on the applicable block(s) of memory cells to permit programming of the block's pages. The erasure can occur before execution of or during the process depicted in FIG. 4.

The definition of a "page" can vary within the art. Some manufacturers define a page by a certain amount of data, so that, for example, two pages of data can correspond to one word line (row). A page of data can also correspond to the amount of data that is written to or read from the NAND flash memory array 102 during a write cycle or read cycle, respectively, e.g., the amount of data corresponding to a word line (row) within the NAND flash memory array 102.

The process begins by receiving 410 a page of "normal" data to be written to the NAND flash memory array 102. This page of normal data has not been encoded by convolution coding, but can optionally include ECC data or other data for the spare bytes.

The process retrieves 420 previous data as applicable for the computation of the supplemental coding, e.g., convolutional coding. In the example described earlier in connection with FIGS. 2 and 3, a convolutional code for a single string of cells was described. In an array of many cells, all of the cells of a particular group (e.g., page) will be written at the same time, and thus, multiple convolutional codes will be generated for each cell in the group. In the foregoing example using simple convolutional coding, the contents (bits) of a previously written row (logically adjacent in the array) are individually used to generate a convolutional code for each of the adjacent bits of the row for which data is to be stored (column wise). In the illustrated example, the prior row data is not always needed. For example, if the row of cells corresponding with the first memory cell 304 is to be written, then there is no need to retrieve data for the convolutional coding. If other rows are to be written, such as the row with the second memory cell 306 of the string 302, then data for the previously written row with the first memory cell 304 of the string 302 is retrieved for the convolutional coding of the string 302. In one embodiment, the other strings are also processed in parallel. It will be understood that the rows for which data is retrieved for convolutional coding can depend on a variety of factors, such as the depth of the convolutional coding. This data for convolutional coding can be retrieved from, for example, a previously written row in the NAND flash memory array 102; however, if the data to be retrieved is available in a cache, it need not be retrieved from the NAND flash memory array 102 itself.

The process performs 430 the supplemental coding, e.g., convolutional coding for the normal data as it is arranged in columns. The order of data for the supplemental code is not the standard order of data, which is arranged by rows. This is an advantage as the error recovery is not dependent on the same row of data as it is with conventional block ECC codes, and thus, provides a greater chance at being able to recover data even in the event of otherwise catastrophic failures, such as failures with word lines. The supplemental coding can be applied to both the data bytes and to the spare bytes, which can include block ECC codes.

The process stores 440 the data to the NAND flash memory array 102. In the illustrated example, the normal data (arranged in rows) is stored in a first level, and the supplemental coded data is stored in a second level. The normal data can include the spare data, including ECC data, and the supplemental coding can also be performed on and stored for the normal data and the spare data as well. While the supplemental coded data is arranged in columns for coding and decoding, the supplemental coded data itself is still written in rows.

Figure 5:
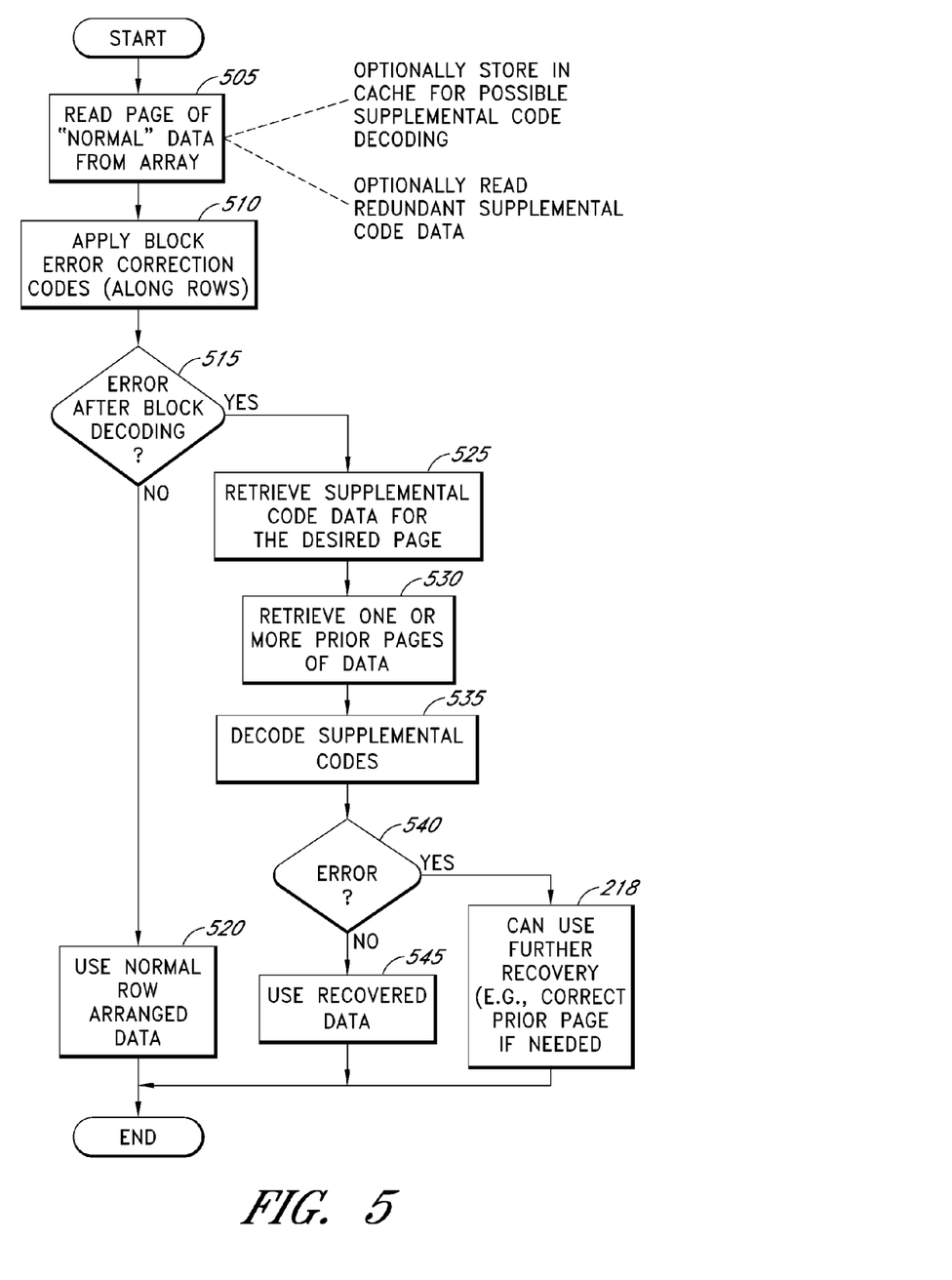
FIG. 5 is a flowchart of a process for reading data from the NAND flash memory.

FIG. 5 is a flowchart of a process for reading data from the NAND flash memory array 102 (FIG. 1). The illustrated process can be modified in a variety of ways. For example, in another embodiment, various portions of the illustrated process can be combined, can be rearranged in an alternate sequence, can be removed, and the like. The process can be performed in hardware or software, and within a memory chip or outside the memory chip.

The process begins by reading 505 "normal" data from the NAND flash memory array 102. For example, the data for a particular row can be read for retrieval of a page of data. This data can optionally be cached, can be stored for possible future code decoding, and the like. For example, when two-level cells are used, the second level can also optionally be read and stored for possible future use.

The process applies 510 the block error correction codes along rows to the retrieved data. This identifies if errors exist, and within certain limits depending on the block codes used, provides the capability to correct errors.

The process determines 515 whether there remain errors after application of the block error correction codes. If the retrieved data is determined to be correctable, that is, correctable to an error-free state after error correction decoding, the process proceeds to use 520 the data (arranged horizontally or in rows), and the process ends. If, on the other hand, the retrieved data is determined to have uncorrectable error, the process proceeds to decode the convolutional coded data in an attempt to recover the data.

This recovery process retrieves 525 the applicable supplemental coded data, e.g., convolutional coded data for the desired page of data. This applies from the second row in the write sequence on down. In the illustrated embodiment, the first row is computed differently than the other rows because there is no other data to be combined for the first row upon which the supplemental coding is based. In the illustrated embodiment, when the data with the errors is from the first row of the write sequence, redundant data can be stored instead and then retrieved 525 rather than supplemental coded data (as illustrated in FIG. 3, with the first cell 304). Other programmed rows (corresponding to cells 306-318 of FIG. 3) store supplemental coded data, such as convolutional coded data. In the illustrated embodiment, the process retrieves 525 the supplemental coded data by reading another level of data storage of the memory cells, such as the second level. This reading of data can be done separately, or it can be performed earlier, such as during the read 505 step described earlier, and recovered from a cache.

The process retrieves 530 one or more previously written pages of data for decoding of the convolutional coded data. For example, the normal, first-level data from the first row can be retrieved 530 for decoding of convolutional coded data of the second-level of the second row. In the illustrated example, a 2-level cell is used and a simple convolutional coding scheme is used. It will be understood that the parameters of supplemental coding, e.g., convolutional coding can be varied, and additional data stored on other levels as desired.

The process decodes 535 the supplemental codes from the data retrieved in the step 525 and the step 530 to generate another copy of the original data, termed recovered data. Advantageously, the recovered data is generated at least partially from a different word line or row, such that if there is a problem with a word line, there is still a chance of recovery of the data. The recovered data can also include block ECC codes as applicable.

The process advances to optionally determine 540 if there was an uncorrectable error in the recovered data. This can be determined by decoding the block ECC codes. The block ECC codes typically also provide some error correction capability should errors exist. If the recovered data is correctable, the recovered data is used 545. Otherwise, the process can stop or can use further error recovery techniques 550. For example, if there was an uncorrectable error in the retrieval 530 of the prior page, that page can also be recovered using the convolutional coding techniques described herein. In addition, it should be noted that in the illustrated example with convolutional coding for the supplemental code, the convolutional coding can retrieve data from either the previous row or the subsequent row. However, it will not always be the case that the subsequent row has been programmed with the convolutional code due to the order in which data is written within the NAND flash memory array 102. In another example, more data can be used where the particular convolutional coding used has more depth.

Figure 6:
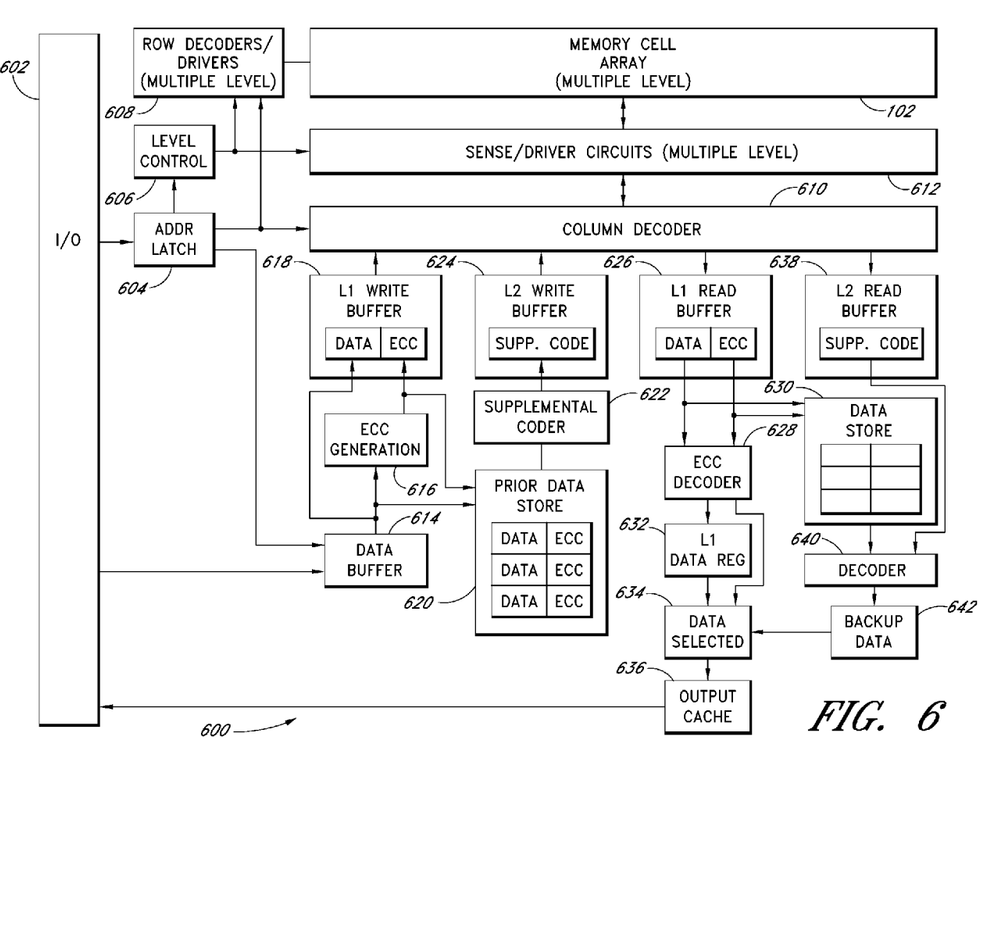
FIG. 6 is a block diagram of a hardware embodiment of the invention.

FIG. 6 is a block diagram of a hardware embodiment of the invention implemented in a memory 600. Many basic control functions, such as read/write control, timing control, and the like, are not shown for clarity. The NAND flash memory array 102 stores data. Input/Output (I/O) circuitry 602 interfaces with the device that uses the memory 600. The input/output (I/O) circuitry can include multiplexers, buffers, or the like. The address lines are latched by an address latch 604, which controls the level control circuit 606, row decoders/drivers 608, and column decoder 610. The level control circuit 606 determines on which level the addressed data resides. The row decoders/drivers 608 select the appropriate word line or row for the latched address, and applies the correct voltage for erasing, writing, or reading. The other rows are also typically activated to permit the selected memory cell to be accessed through the string. The string, or columns, are driven by sense/driver circuits 612. The sense/driver circuits 612 erase, write the data to, or read the data from the NAND flash memory array 102 as appropriate. The column decoder 610 selects appropriate strings for the address.

Data to be written is stored in a data buffer 614. The data may be provided incrementally in relatively small amounts, such as, but not limited to 8, 16, 32 bits at a time, and the addresses of the particular bytes received can be indicated by, for example, the lower address lines. When data for the page has been received, the memory 600 performs a write cycle. An ECC generation circuit 616 generates block codes, such as block error correction codes, for the contents in the data buffer 614. The ECC check data can alternatively be generated outside of the memory 600. In the illustrated embodiment, a first level L1 stores the "normal" data, and an L1 write buffer 618 stores the page data for retrieval by the column decoder 610. A prior data store 620, which can be, for example, a memory cache or registers, stores the data for the page that is written. This allows the data to be available for a supplemental coding, e.g., convolutional coding, with data from a subsequent page (further down the NAND flash string).

A supplemental coder 622 generates the supplemental codes, e.g., convolutional codes. For example, the supplemental coder 622 can implement the logic described earlier in connection with FIG. 2. For example, the supplemental coder 622 can perform supplemental coding of the present page that is being written to the NAND flash memory array 102 with the prior page written. The data for the prior page can be retrieved from the prior data store 620, or if needed, can be retrieved from the NAND flash memory array 102 itself. In the illustrated embodiment, the supplemental coded data is stored to an L2 write buffer 624, and the data is ready to be written to the NAND flash memory array 102. Other levels can also be used depending on the parameters of the supplemental code and the configuration of the NAND flash memory array 102.

For reading of data from the NAND flash memory array 102, the selected page is read and temporarily stored in an L1 read buffer 626. An ECC decoder 628 retrieves page data from the L1 read buffer 626 for decoding of block error correction codes. The decoding of block error correction codes detects and/or corrects errors, within limits of the error correction code employed. The page data from the L1 read buffer 626 can also be stored in a data store 630 for use in the decoding of supplemental codes, e.g., convolutional codes, for one or more pages that may use the page data from the page being read. In one embodiment, the page data is cached in the data store 630 even when not immediately used to avoid having to read the page later.

The page data, corrected as necessary by block error correction codes, is stored in an L1 data register 632. A data selector 634 selects the page data from the L1 data register 632 for an output cache 636 if the page data had been properly decoded by the block error correction codes (correctable). Otherwise, the data selector 634 selects a page of data reconstructed from the decoding of supplemental codes, e.g., convolutional codes.

For example, the supplemental coded data is retrieved from the second level of the NAND flash memory array 102 and stored in an L2 read buffer 638. A decoder 640, such as a deconvolver decodes the supplemental coded page data from the L2 read buffer 638 using prior page data from the data store 630 to generate another copy of the original data or recover data. In one embodiment in which the supplemental coded data corresponds to convolutional codes, the decoder 640 is a Viterbi decoder. It will be understood that if the prior page data is not present in the data store 630, such data can be retrieved as necessary. In one embodiment, the decoder 640 can also include block error correction decoding of the recovered data. In addition, if error is still present, such as errors in the previous page, then the previous page can also be recovered.

Many variations are possible. For example, the data store 630 can retrieve data after it has been decoded by the ECC decoder 628. In another example, the same ECC decoder 628 can be used for block decoding of the recovered data from the decoder 640.

In one embodiment, the memory 600 is configurable such that an end user can select, for example, between a configuration featuring the error recovery techniques as illustrated in FIG. 6, and a configuration with the supplemental code error recovery techniques disabled for greater utilization of memory capacity.

Figure 7:
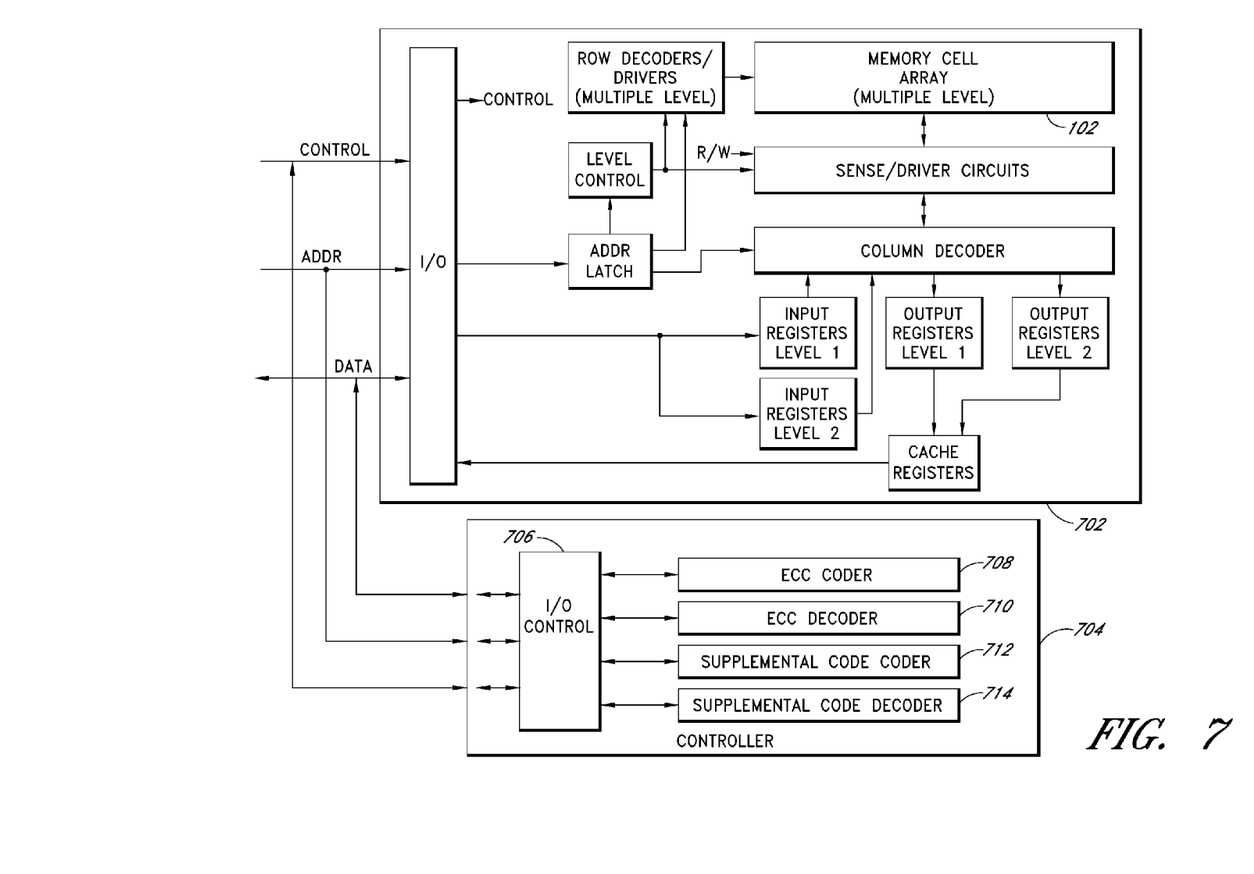
FIG. 7 is a block diagram of an example of a NAND flash memory and a controller for the computation, storage, retrieval and decoding of the convolutional coded data.

FIG. 7 is a block diagram of an example of a NAND flash memory 702 and a controller 704 for the computation, storage, retrieval and decoding of the supplemental coded data, e.g., convolutional coded data. The controller 704 can be implemented in hardware or in software (including firmware) or by a combination of both. In one embodiment, the controller 704 is physically located with the hardware that uses the NAND flash memory 702, which permits a conventional, off-the-shelf NAND flash memory 702 (with multiple levels) to be used.

The illustrated controller 704 includes an input/output control circuit 706, an ECC coder circuit 708, an ECC decoder circuit 710, a supplemental coder circuit 712, and a decoder circuit 714. In one embodiment, the ECC coder circuit 708 and the ECC decoder circuit 710 are optional. The input/output control circuit 706 can include, for example, registers, buffers, and control logic. The ECC coder circuit 708 computes block error correction codes for data stored along rows of the NAND flash memory array 102. The ECC decoder circuit 710 decodes the block error correction codes to detect errors and for error correction. The supplemental coder circuit 712 computes supplemental codes, e.g., convolutional codes, for data stored along columns of the NAND flash memory array 102. The decoder circuit 714, such as a deconvolver, decodes the supplemental code data. In one embodiment, the input/output control circuit 706 includes a selection circuit configured to select between the data as retrieved and possibly corrected by ECC codes and the data as recovered from supplemental codes depending on the outcome of the ECC decoding.

One embodiment is a method of storing error recovery data for a NAND flash memory array having two or more levels, wherein the method includes: storing data with a block error correction code using a first level of multiple-level cells and along a first dimension of the NAND flash memory array; and storing data with a supplemental error correction code using a second level of the multiple-level cells and along a second dimension of the NAND flash memory array, wherein the supplemental error correction code is incrementally updateable. Examples of applicable supplemental error correction codes include convolutional codes, partial-response, maximum likelihood (PRML) codes, and trellis-coded modulation (TCM).

One embodiment is a method of recovering data from a NAND flash memory array, wherein the method includes: reading a page of data from a first selected row of the memory array; performing block decoding of error correction codes of the page of data; determining that error exists after block decoding of the page of data; and decoding supplemental error correction codes relating to the first selected row to recover the page of data, wherein the supplemental error correction codes are arranged along columns of the memory array, wherein the supplemental error correction codes are incrementally updateable.

One embodiment is an apparatus, wherein the apparatus includes: an interface circuit configured to receive data intended for storage to a memory device and to communicate with the memory device, wherein data for the memory device is stored in rows and columns of a NAND flash memory array, and wherein cells of the NAND flash memory array store data in at least two levels; and a supplemental error correction coder circuit coupled to the interface circuit, the supplemental error correction coder circuit configured to compute supplemental error correction codes by columns of data, wherein the supplemental error correction codes are incrementally updateable.

One embodiment is an apparatus, wherein the apparatus includes: an interface circuit configured to receive data intended for storage to a memory device and to communicate with the memory device, wherein data for the memory device is stored in rows and columns of a NAND flash memory array, and wherein cells of the NAND flash memory array store data in at least two levels; and a supplemental decoder circuit coupled to the interface circuit, the supplemental decoder circuit configured to decode supplemental error correction codes to recover data, wherein the supplemental error correction codes are incrementally updateable.

One embodiment is an apparatus, wherein the apparatus includes: a NAND flash memory array having rows and columns, wherein each cell of the NAND flash memory stores at least two bits of data, wherein data is written to and read from the NAND flash memory array in rows; a supplemental error correction coding circuit configured to compute supplemental error correction codes by columns of normal data; and a supplemental decoding circuit configured to decode supplemental error correction codes stored in the NAND flash memory array to recover data, wherein the supplemental error correction codes are incrementally updateable.

Various embodiments have been described above. Although described with reference to these specific embodiments, the descriptions are intended to be illustrative and are not intended to be limiting. Various modifications and applications may occur to those skilled in the art without departing from the true spirit and scope of the invention as defined in the appended claims.

I claim:

1. A method of storing error recovery data for a memory array having two or more levels, the method comprising:
   storing data with a block error correction code using a first level of multiple-level cells and along a first dimension of the memory array;
   storing data with a supplemental error correction code using a second level of the multiple-level cells and along a second dimension of the memory array, wherein the second dimension is along a column of the memory array, wherein the supplemental error correction code is incrementally updateable; and
   computing a supplemental error correction code based on data stored in a first level of a previously-written row and current data to be stored.

2. The method of claim 1, wherein computing the supplemental error correction code comprises computing a convolutional code, the method further comprising:
   computing an exclusive-OR (XOR) of a data bit to be stored in the first level of a first cell of a string with a data bit stored in the first level of a second cell of the logically adjacent to the first cell; and storing the computed data bit in the second level of the first cell.

3. The method of claim 1, wherein the supplemental error correction code comprises a convolutional code.

4. The method of claim 1, wherein the supplemental error correction code comprises a partial-response, maximum likelihood (PRML) code.

5. The method of claim 1, wherein the supplemental error correction code comprises trellis-coded modulation (TCM).

6. The method of claim 1, wherein the block error correction code comprises cyclic redundancy check (CRC) checksums.

7. The method of claim 1, wherein the block error correction code comprises Reed-Solomon codes.

8. An apparatus comprising:
an interface circuit configured to receive data intended for storage to a memory device and to communicate with the memory device, wherein cells of the memory device comprise memory cells that store data in at least two levels, wherein the interface circuit is configured to retrieve data without supplemental error correction codes along a first dimension of the memory device, and to retrieve supplemental error correction coded data along a second dimension of the memory device, wherein the second dimension is orthogonal to the first dimension, wherein the interface circuit is configured to retrieve data without supplemental error correction codes from a first level of the array of the memory device, and to retrieve supplemental error correction coded data on a level other than the first level; and
a supplemental decoder circuit coupled to the interface circuit, the supplemental decoder circuit configured to decode supplemental error correction codes to recover data, wherein the supplemental error correction codes are incrementally updateable.

9. The apparatus of claim 8, wherein the supplemental error correction codes comprise convolutional codes.

10. The apparatus of claim 8, wherein the supplemental error correction codes comprise partial-response, maximum likelihood (PRML) codes.

11. The apparatus of claim 8, wherein the supplemental error correction codes comprise trellis-coded modulation (TCM).

12. The apparatus of claim 8, further comprising a block error correction code generation circuit configured to compute block error correction codes for data and a block error correction code decoding circuit configured to correct errors in the data.

13. The apparatus of claim 12, wherein the block error correction codes comprises cyclic redundancy check (CRC) checksums.

14. An apparatus comprising:
a memory array, wherein each cell of the memory array stores at least two bits of data, wherein data is written to and read from the memory array along a first dimension;
a supplemental error correction coding circuit configured to compute supplemental error correction codes stored along a second dimension of the memory array that is orthogonal to the first dimension, wherein normal data is written in a first level of the memory array, and the supplemental error correction codes are written in a second level of the memory array; and
a supplemental decoding circuit configured to decode supplemental error correction codes stored in the memory array to recover data, wherein the supplemental error correction codes are incrementally updateable.

15. The apparatus of claim 14, wherein the supplemental error correction codes comprise convolutional codes.

16. The apparatus of claim 14, wherein the supplemental error correction codes comprise partial-response, maximum likelihood (PRML) codes.

17. The apparatus of claim 14, wherein the supplemental error correction codes comprise trellis-coded modulation (TCM).

18. The apparatus of claim 14, wherein the supplemental error correction coding circuit comprises a convolutional coder, a data store, and a write buffer, and wherein the supplemental decoding circuit comprises a deconvolver, a data store, and a read buffer.

19. The apparatus of claim 14, further comprising a block error correction code generation circuit configured to compute block error correction codes for normal data and a block error correction code decoding circuit configured to correct errors in normal data.

20. The apparatus of claim 19, wherein the block error correction codes comprises cyclic redundancy check (CRC) checksums.

* * * * *